United States Patent
Pahl et al.

(10) Patent No.: US 6,449,828 B2
(45) Date of Patent: Sep. 17, 2002

(54) METHOD OF PRODUCING A SURFACE ACOUSTIC WAVE COMPONENT

(75) Inventors: Wolfgang Pahl; Alois Stelzl; Hans Krüger, all of München (DE)

(73) Assignee: Siemens Matsushita Components GmbH & Co. KG, Munich (DE)

( * ) Notice: Subject to any disclaimer, the term of this patent is extended or adjusted under 35 U.S.C. 154(b) by 0 day.

(21) Appl. No.: 09/795,099

(22) Filed: Feb. 28, 2001

Related U.S. Application Data

(62) Division of application No. 09/103,166, filed on Jun. 22, 1998, now Pat. No. 6,242,842, which is a continuation of application No. PCT/DE96/02408, filed on Dec. 16, 1996.

(30) Foreign Application Priority Data

Dec. 21, 1995 (DE) .......................................... 195 48 062

(51) Int. Cl.⁷ ............................................. H01Q 13/00
(52) U.S. Cl. ...................... 29/600; 29/25.35; 29/25.01; 310/313 R; 310/344; 427/100
(58) Field of Search ...................... 29/600, 593, 25.35, 29/25.01, 841, 601; 310/313 R, 313 B, 313 A, 344, 348; 427/100, 531

(56) References Cited

U.S. PATENT DOCUMENTS

| | | | |
|---|---|---|---|
| 4,037,176 A | * 7/1977 | Ono et al. ................. 333/30 R |
| 4,293,986 A | 10/1981 | Kobayashi et al. | |
| 4,356,423 A | 10/1982 | Gudzin | |
| 4,890,369 A | * 1/1990 | Tanski ........................ 29/25.35 |
| 4,925,524 A | * 5/1990 | Beatty ......................... 156/643 |
| 5,177,324 A | * 1/1993 | Carr et al. ................. 174/35 R |
| 5,390,401 A | * 2/1995 | Shikata et al. .............. 29/25.35 |
| 5,392,006 A | 2/1995 | Ikeda et al. | |
| 5,459,368 A | 10/1995 | Onishi et al. | |
| 5,541,557 A | 7/1996 | Ikeda et al. | |
| 5,769,997 A | 6/1998 | Akaike et al. | |
| 5,771,556 A | * 6/1998 | Allen et al. .................... 29/600 |
| 5,783,868 A | * 7/1998 | Galloway .................... 257/874 |
| 5,815,900 A | * 10/1998 | Ichikawa et al. ........... 29/25.35 |
| 5,920,142 A | 7/1999 | Onishi et al. | |
| 6,136,175 A | * 10/2000 | Stelzl et al. ................. 205/220 |
| 6,242,842 B1 | * 6/2001 | Pahl et al. .............. 310/313 R |
| 6,310,420 B1 | * 10/2001 | Pahl et al. .............. 310/313 R |
| 2002/0043889 A1 | * 4/2002 | Inoue et al. ............ 310/313 B |

* cited by examiner

*Primary Examiner*—Peter Vo
*Assistant Examiner*—Minh Trinh
(74) *Attorney, Agent, or Firm*—Laurence A. Greenberg; Werner H. Stemer; Ralph E. Locher

(57) ABSTRACT

A method of making a SAW component has electrically conductive structures on a substrate. A cap cover encapsulates and seals the structures against environmental influences. An RF shield is placed on the cap cover. The RF shield is a metallization formed of a material layer sequence of TiW, Cu or Ni and Au which is then reinforced with current-less or galvanic deposition.

2 Claims, 2 Drawing Sheets

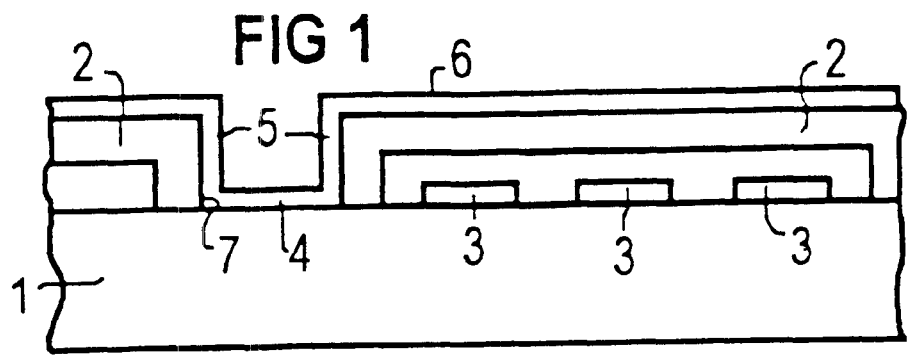
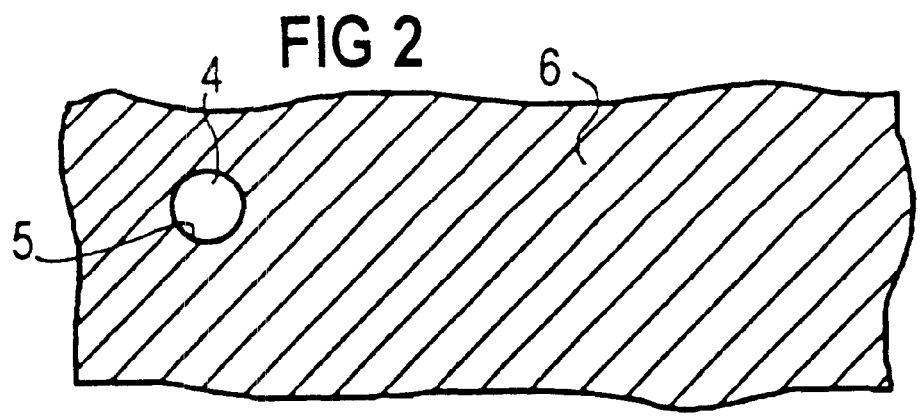
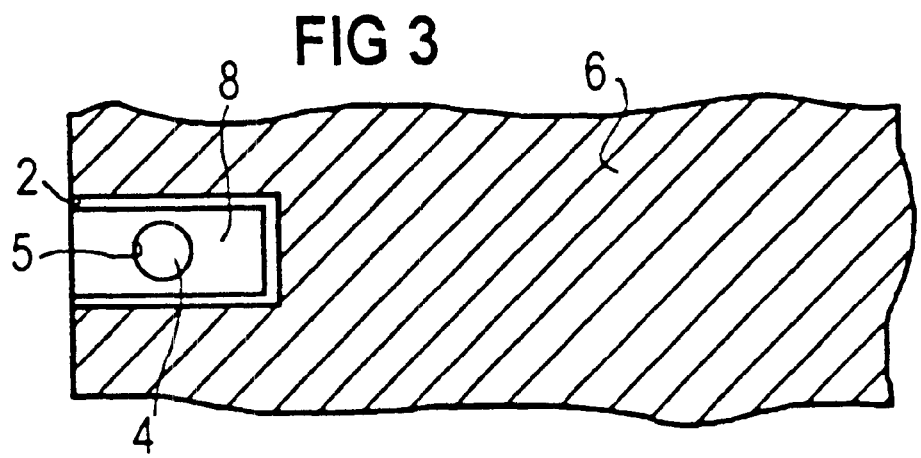

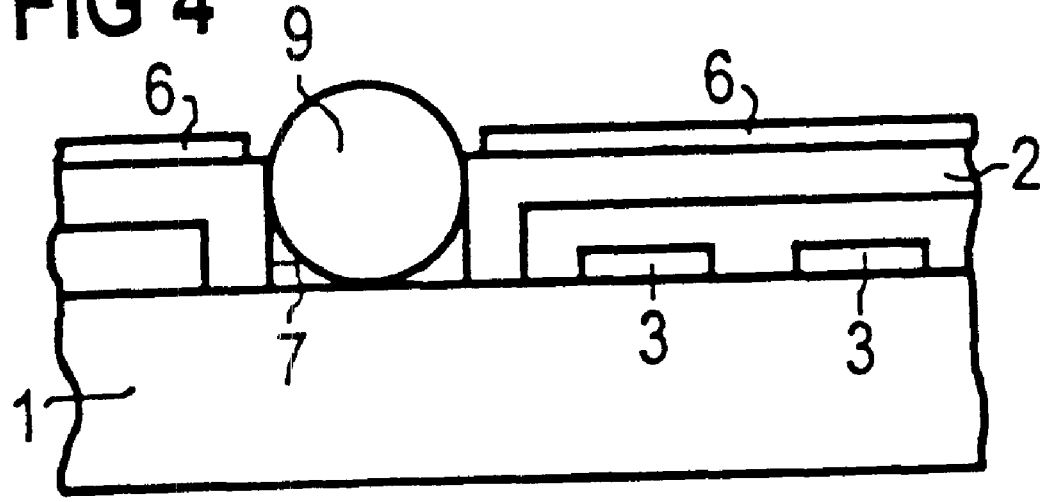

US 6,449,828 B2

METHOD OF PRODUCING A SURFACE ACOUSTIC WAVE COMPONENT

CROSS-REFERENCE TO RELATED APPLICATION

This is a division of U.S. application No. 09/103,166, filed Jun. 22, 1998, now U.S. Pat. No. 6,242,842, issued Jun. 5, 2001 which was a continuation of copending international application PCT/DE96/02408, filed Dec. 16, 1996, which designated the United States.

BACKGROUND OF THE INVENTION

FIELD OF THE INVENTION

The present invention relates to a method of producing a surface acoustic wave component. Electrically conductive structures are disposed on a substrate and encapsulated, i.e., sealed against environmental influences, by a cap cover. The SAW component is provided with a cover metallization which acts as an RF shield.

An earlier, commonly owned application No. 08/743,540 which is U.S. Pat. No. 5,831,369 (see international published application WO 95/30276) describes an encapsulation for electronic components with a cap that seals component structures on a substrate. The cap is formed by a cover which is provided on the substrate and has cutouts accommodating the component structures in regions thereof. Such an encapsulation protects the component structures against environmental influences, with the result that electronic components encapsulated in such a way can be used directly in further applications, without the need for an additional housing.

When such components are fitted in a ceramic casing and the casing is sealed with glass solder for cost reasons, then the component is not effectively RF shielded since the cover is then composed of ceramic and there is no conductive connection to the cover. When the casing is formed of plastic material, then an analogous situation results.

German published non-prosecuted patent application DE 31 38 743 A1 discloses a SAW filter enclosed in a metallic casing and sealed on all sides which avoids the above disadvantages.

SUMMARY OF THE INVENTION

It is accordingly an object of the invention to provide a method of producing a surface acoustic wave component, which overcomes the above-mentioned disadvantages of the prior art devices and methods of this general type and which provides for an effective RF shield for electronic components of this type.

With the foregoing and other objects in view there is provided, in accordance with the invention, an electrical component, in particular a SAW component operating with surface acoustic waves, comprising:

a substrate, electrically conductive structures disposed on the substrate, and a cap cover encapsulating and sealing the electrically conductive structures against environmental influences; and an RF shielding metallization disposed on the cap cover, the metallization being a layer sequence formed with a layer of titanium/tungsten, a layer of a metal selected from the group consisting of copper and nickel, and a layer of gold.

In accordance with an added feature of the invention, the layer of titanium/tungsten and the copper layer have a layer thickness of less than 0.1 $\mu$m, the layer of nickel has a layer thickness of approximately 1 $\mu$m, and the layer of gold has a layer thickness of about 0.05 $\mu$m.

In accordance with an additional feature of the invention, the conductive structures include a ground connecting pad for electrically connecting the conductive structures, the cap cover has a window formed therein, and the metallization is electrically connected to the pad via a through-plated hole through the window in the cap cover.

With the above and other objects in view there is also provided, in accordance with the invention, a method of producing a surface acoustic wave component, which comprises:

providing a substrate and forming electrically conductive SAW structures on the substrate, encapsulating and sealing the structures against environmental influences with a cap cover; and forming an RF-shielding metallization on the cap cover, by initially vapor-depositing a material layer sequence of TiW, Cu or Ni and Au, and reinforcing with a process selected from the group consisting of a current-less process and a galvanic process.

In accordance with a concomitant feature of the invention, the metallization is formed by vapor depositing the layer sequence of TiW, Cu or Ni and Au, structuring the metal layer by pulsed laser radiation, and non-electrically reinforcing the vapor deposited layer with Cu.

Other features which are considered as characteristic for the invention are set forth in the appended claims.

Although the invention is illustrated and described herein as embodied in a method of producing a surface acoustic wave component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a partial schematic side elevation of a SAW component with shielding according to the invention;

FIG. 2 is a partial schematic plan view of the component according to FIG. 1;

FIG. 3 is a similar view of a SAW component suitable for SMD mounting and provided with an RF shield according to the invention; and FIG. 4 is a partial schematic side elevation of a SAW component which is suitable for flip-chip mounting and has RF shielding according to the invention.

DESCRIPTION OF THE PREFERRED EMBODIMENTS

Referring now to the figures of the drawing in detail and first, particularly, to FIG. 1 thereof, there is seen a surface acoustic wave (SAW) component which, in principle, comprises a piezoelectric substrate 1 and conductive structures 3 disposed on the substrate. Such conductive structures 3 which may be, for example, the electrode fingers of interdigital transducers, resonators or reflectors. As already described in the above-mentioned copending application Ser. No. 08/743,540 (herewith incorporated by reference), the electrically conductive structures 3 are covered by a cap 2 which protects the structures against environmental influences. The component, together with the cover 2 and the substrate 1, may be directly used as a "casing", or it can be fitted into a casing.

A metallization 6 which is used for RF shielding is provided on the cap 2. The metallization 6 is formed by a material layer sequence of TiW, Cu or Ni and Au and is conductively connected to a pad 4 (the connecting surface 4 of the component structures 3) via a through-plated hole 5 which passes through a window 7 in the cap 2. The metallization 6 which is used for RF shielding can be connected to ground via the pad 4.

FIG. 2 shows as a detail a part of the component according to FIG. 1 with the pad 4 and the through-plated hole 5, as well as the metallization 6 which covers the surface.

FIG. 3 shows a plan view of one embodiment of an RF shielded component which is suitable for SMD mounting. In this case, a solderable metallization 8 is provided on the surface of the cap 2 according to FIG. 1 and is conductively connected to a pad 4 via the through-plated hole 5. The multilayer metallization 6 which is used for RF shielding is thereby electrically insulated from the solderable metallization 8.

FIG. 4 shows a schematic illustration of an RF-shielded embodiment of a SAW component that is suitable for flip-chip mounting. In this embodiment, in which identical elements to those in the embodiment according to FIG. 1 are provided with the same reference symbols, a bump 9 is provided in the window 7 and is soldered on the substrate surface to a pad, which is not illustrated per se. The component can be mounted in an electrical circuit via such bumps 9. Additional information in this regard may be gleaned from our published international application WO 97/23950 (and copending, concurrently filed application No. (atty. docket number GR 95 P 2262 P)), which is herewith incorporated by reference.

In the multilayer metallization 6 that forms the RF shield, the titanium and tungsten layer ensures the adhesion capability on the cover 2, the nickel layer ensures the soldering capability, and the gold layer ensures oxidation protection. The layer thicknesses of titanium/tungsten are preferably less than 0.1 $\mu$m, that of nickel is about 1 $\mu$m and that of gold is about 0.1 or 0.05 $\mu$m. The metallization 6 can be produced in such a manner that a thin metallic layer is initially vapor-deposited onto the cover 2 and is then galvanically reinforced.

A particularly cost-effective variant comprises vapor-deposition of a layer sequence of TiW, Cu or Ni and Au, whose overall thickness is less than 10 $\mu$m, preferably being equal to 0.3 $\mu$m. The layer is structured by pulsed laser radiation and current-less reinforcement with Cu. The through-plated hole 5 is also produced at the same time. Finally, Au can be deposited with a thickness of 0.05 $\mu$m for passivation.

Since the through-plated holes 5 are produced on a substrate wafer which contains a multiplicity of components, they can also be positioned such that some of the through-plated hole is in each case associated with a component system, that is to say one through-plated hole is sufficient for two component systems.

The reliability can likewise be improved by providing redundant through-plated holes, that is to say by allocating two through-plated holes to one pad.

We claim:

1. A method of producing a surface acoustic wave component, which comprises:

providing a substrate and forming electrically conductive SAW structures on the substrate, encapsulating and sealing the structures against environmental influences with a cap cover; and forming an RF-shielding metallization on the cap cover, by initially vapor-depositing a material layer sequence of TiW, Cu or Ni and Au, and then reinforcing a metal onto said material layer sequence formed on the cap cover with a process selected from the group consisting of a current-less process and a galvanic process.

2. The method according to claim 1, wherein the forming step comprises vapor depositing the layer sequence of TiW, Cu or Ni and Au, structuring by pulsed laser radiation, and non-electrically reinforcing with Cu.

* * * * *